US006545539B1

United States Patent
Prikhodko et al.

(10) Patent No.: US 6,545,539 B1
(45) Date of Patent: Apr. 8, 2003

(54) AMPLIFIER FOR USE IN A MOBILE PHONE

(75) Inventors: Dimitri Pavlovich Prikhodko, Nijmegen (NL); Josep Ignasi Cairo Molins, Nijmegen (NL); Hendrik Arend Visser, Nijmegen (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/656,124

(22) Filed: Sep. 6, 2000

(30) Foreign Application Priority Data

Sep. 8, 1999 (EP) .............................. 99202921

(51) Int. Cl.⁷ ................................................ H03G 3/10
(52) U.S. Cl. ....................................... 330/285; 330/296
(58) Field of Search ................................ 330/285, 296, 330/279

(56) References Cited

U.S. PATENT DOCUMENTS 5,220,290 A * 6/1993 Black .......................... 330/279
5,285,143 A    2/1994 Bahr et al. ................... 318/805

FOREIGN PATENT DOCUMENTS

EP         0425035 A2    5/1991

OTHER PUBLICATIONS

"Low–Voltage Low–Power Controllable Preamplifier for Electret Microphones", by Albert C. van der Woerd et al., IEEE Journal of Solid State Circuits, vol. 28, No. 10, Oct. 1993, pp. 1052–1055.

* cited by examiner

Primary Examiner—Michael B Shingleton
(74) Attorney, Agent, or Firm—Steven R. Biren

(57) ABSTRACT

An amplifier for use in a mobile phone for supplying a signal ($I_o$) to a load ($Z_L$) comprises a first transistor ($T_1$) having a first main terminal coupled to a reference terminal (GND), a control terminal, and a second main terminal for supplying the signal ($I_o$) to the load ($Z_L$), and sensing means for determining the value of the signal ($I_o$). The sensing means comprises a second transistor ($T_2$) having a first main terminal coupled to the first main terminal of the first transistor ($T_1$), a control terminal coupled to the control terminal of the first transistor ($T_1$), and a second main terminal for supplying a further signal ($I_F$) which is a representation of the signal ($I_o$). The amplifier comprises detection means (DMNS) for supplying a DC-component ($I_{DC2}$) of the further signal ($I_F$). The detection means (DMNS) comprises a resistor (R) coupled between a power supply terminal ($V_{DD}$) and the second main terminal of the second transistor ($T_2$), and a capacitor (C) coupled between the second main terminal of the second transistor ($T_2$) and the reference terminal (GND) or the power supply terminal ($V_{DD}$). The DC-component of the signal ($I_0$) is proportional to the signal ($I_0$) and is thus also proportional to the power supplied to the load ($Z_L$). Since the further signal ($I_F$) is a representation of the signal ($I_0$) supplied to the load ($Z_L$), the DC-component ($I_{DC2}$) of the further signal ($I_F$) is a measure for the power supplied to the load ($Z_L$).This measure can be used to monitor the amount of power supplied to the load ($Z_L$) and possibly to regulate the power to a desired level.

10 Claims, 1 Drawing Sheet

AMPLIFIER FOR USE IN A MOBILE PHONE

BACKGROUND OF THE INVENTION

The invention relates to an amplifier for supplying a signal to a load, comprising a first transistor having a first main terminal coupled to a reference terminal, a control terminal, and a second main terminal for supplying the signal to the load, and sensing means for determining the value of the signal.

Such an amplifier is known from the U.S. Pat. No. 5,285,143.

In the known amplifier, a sense current is generated from a load current which is scaled down such that the sense current is an accurate representation of the load current but has a substantially smaller magnitude. The scaled down sense current is generated by coupling a power sense resistor in series with the load current and develops a load voltage across this resistor. A sense voltage, being substantially equal to the load voltage, is applied to a pilot sense resistor by a voltage follower. The pilot sense resistor is some predetermined ratio of the power sense resistor. The sense current flowing through the pilot sense resistor is scaled down in accordance with the ratio of the power resistor to the pilot sense resistor. A current mirror supplies current to the voltage follower.

A problem of the known amplifier is that a sensing element, for example formed by a resistor, is coupled in series with the first transistor. Though a high accuracy of the sense signal (current) can be accomplished in this manner in principle, the circuitry needed in order to reach this accuracy is quite complicated.

SUMMARY OF THE INVENTION

It is an object of the invention to provide an amplifier which eliminates the above-mentioned problem.

To this end, according to the invention, the amplifier of the type defined in the opening paragraph is characterized in that the sensing means comprises a second transistor having a first main terminal coupled to the first main terminal of the first transistor, a control terminal coupled to the control terminal of the first transistor, and a second main terminal for supplying a further signal which is a representation of the signal, and in that the amplifier comprises detection means for supplying a DC-component of the further signal.

The invention is based on the insight that for many applications, and especially for mobile phones, amplifiers do not operate in the so called class A mode in which the power consumption is relatively high, but operate in a lower-energy mode, for example in the so called class B or class C mode. In these modes the signal comprises a DC component which is proportional to the signal and is thus also proportional to the power supplied to the load. Since the further signal is a representation of the signal supplied to the load, the further signal also comprises a DC-component which is a measure for the power supplied to the load. This measure can be used to monitor the amount of power supplied to the load and possibly to regulate the power to a desired level.

An embodiment of the invention may be characterized in that the detection means comprises a resistor coupled between a power supply terminal and the second main terminal of the second transistor, and a capacitor coupled between the second main terminal of the second transistor and the reference terminal. By so doing, a simple implementation of the detection means is accomplished. As an alternative solution the capacitor may also be connected between the second main terminal of the second transistor and the power supply terminal.

BRIEF DESCRIPTION OF THE DRAWING

The invention will be described in more detail with reference to the accompanying drawing, in which:

the sole FIGURE is a circuit diagram of an embodiment of an amplifier according to the invention.

DESCRIPTION OF THE PREFERRED EMBODIMENTS

Figure 1:
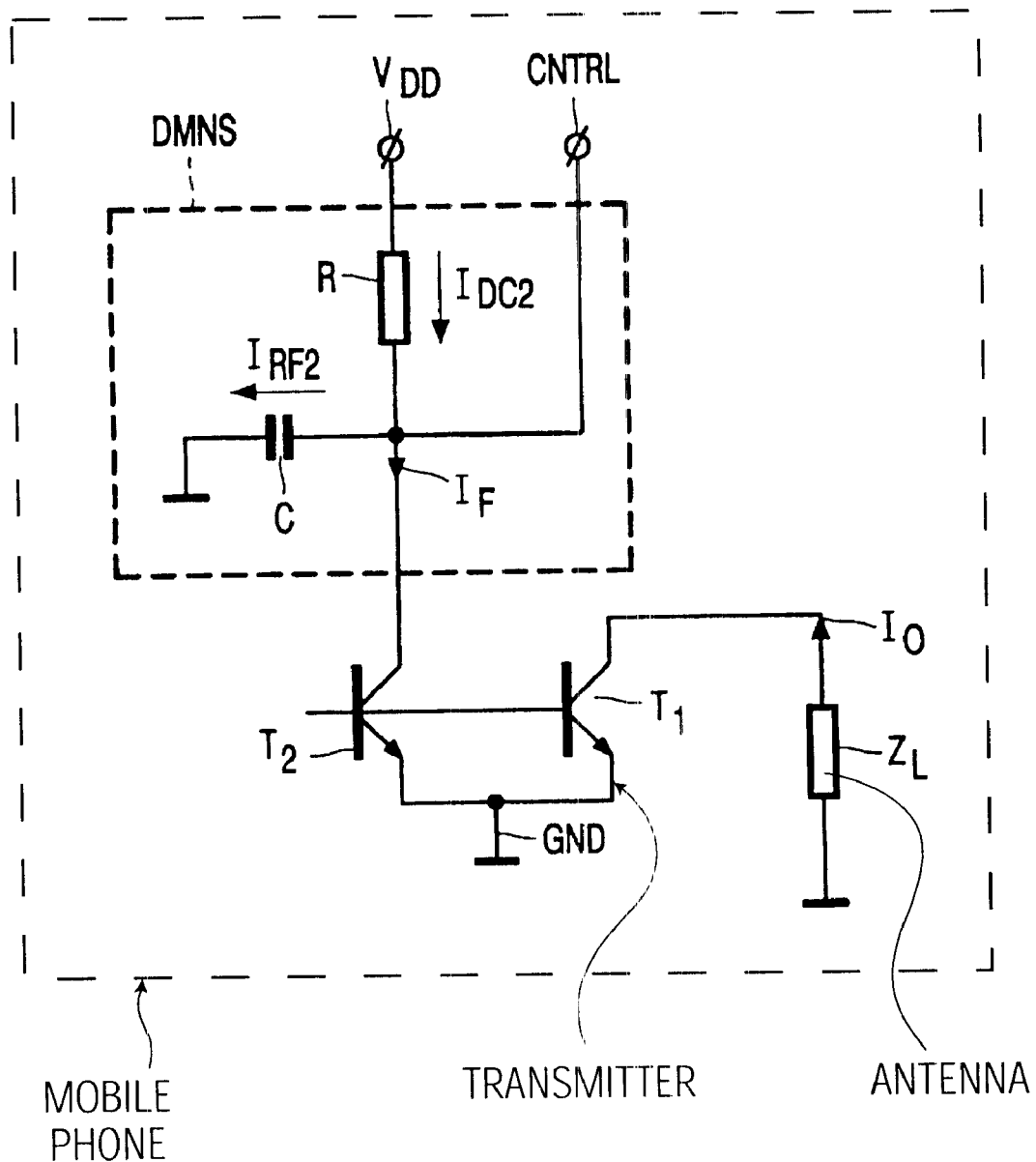

The FIGURE shows a circuit diagram of part of the amplifier which comprises a first bipolar transistor $T_1$, a second bipolar transistor $T_2$, and detection means DMNS formed by a resistor R and a capacitor C. A load $Z_L$ is connected between the collector of the first bipolar transistor $T_1$ and a reference terminal GND. The emitters of the first and the second bipolar transistors $T_1$–$T_2$ are connected to the reference terminal GND. The collector of the second bipolar transistor $T_2$ is connected to a control terminal CNTRL. The resistor R is connected between a power supply terminal $V_{DD}$ and the control terminal CNTRL. The capacitor C is connected between the control terminal CNTRL and the reference terminal GND or, alternatively, between the control terminal CNTRL and the power supply terminal ($V_{DD}$) as shown by the dashed lines in the FIGURE.

The principle of operation of the circuit is as follows. The first and second bipolar transistors $T_1$ and $T_2$ are dimensioned such that the further signal current $I_F$, which flows through the first bipolar transistor $T_1$, is a fraction of the signal current $I_o$, which signal current $I_o$ flows through the first bipolar transistor $T_1$ and through the load $Z_L$. If the first and second bipolar transistors $T_1$ and $T_2$ are matched in a proper way, for instance by integrating both the first and the second bipolar transistors $T_1$–$T_2$ in the same integrated circuit, the further signal current $I_F$ is an accurate, but much smaller, copy of the signal current $I_o$. Under the assumption that the amplifier is, for example, operating in the so-called class C mode, the signal $I_o$ comprises a DC-component which is a measure for the signal $I_o$ and as a consequence it is also a measure for the amount of power supplied to the load $Z_L$. Since the further signal $I_F$ accurately matches the signal $I_o$, the further signal $I_F$ also comprises a DC-component $I_{DC2}$ which accurately matches the DC-component of the signal $I_o$. Thus the DC-component $I_{DC2}$ is an accurate representation of the amount of power supplied to the load $Z_L$. The capacitor C forms a short-circuit for AC-currents. For this reason only the DC-component $I_{DC2}$ flows through the resistor R, causing a DC-voltage across the resistor R. This DC-voltage is made available via a control terminal CNTRL. Since this DC-voltage is an accurate measure for the power supplied to the load $Z_L$, this DC-voltage can be used to monitor the amount of power supplied to the load $Z_L$ and possibly to regulate the power to a desired level.

Instead of bipolar transistors, other active amplifier elements, such as field effect transistors, may alternatively be used.

The FIGURE also shows, in simplified form, a mobile phone, represented by the dashed line box enclosing the circuitry, including an antenna represented by load $Z_L$ and a transmitter including transistor $T_1$ connected to the load.

What is claimed is:

1. An amplifier for supplying a signal ($I_0$) to a load ($Z_L$), comprising a first transistor ($T_1$) having a first main terminal connected to a reference terminal (GND), a control terminal, and a second main terminal for supplying the signal ($I_0$) to the load ($Z_L$), and sensing means for determining the value of the signal ($I_0$), characterized in that the sensing means comprises a second transistor ($T_2$) having a first main terminal connected to the first main terminal of the first transistor ($T_1$), a control terminal connected to the control terminal of the first transistor ($T_1$), and a second main terminal for supplying a further signal ($I_F$) which is a representation of the signal ($I_0$), and in that the amplifier comprises detection means (DMNS) having a control terminal (CNTRL) for measuring the further signal ($I_F$).

2. A mobile phone comprising a transmitter having an antenna for transmitting a modulated high-frequency signal, comprising an amplifier of the type as claimed in claim 1, wherein the load ($Z_L$) is formed by the antenna.

3. An amplifier as claimed in claim 1, characterized in that the detection means (DMNS) comprises a circuit having a resistor (R) and a capacitor (C) for supplying a DC-component of the further signal ($I_F$).

4. An amplifier as claimed in claim 3, characterized in that the control terminal (CNTRL) is coupled to measure said DC-component.

5. An amplifier as claimed in claim 4, characterized in that the DC-component is an DC voltage across the resistor (R).

6. An amplifier as claimed in claim 3, characterized in that the resistor (R) is connected between a power supply terminal ($V_{DD}$) and the second main terminal of the second transistor ($T_2$), and the capacitor (C) is connected between the second main terminal of the second transistor ($T_2$) and the reference terminal ($V_{DD}$).

7. An amplifier as claimed in claim 3, characterized in that the resistor (R) is connected between a power supply terminal ($V_{DD}$) and the second main terminal of the second transistor ($T_2$), and the capacitor (C) is connected between the second main terminal of the second transistor ($T_2$) and the power supply terminal ($V_{DD}$).

8. An amplifier as claimed in claim 1, characterized in that the main terminals of both the first and second transistors ($T_1$, $T_2$) are directly connected to the reference terminal (GRD).

9. An amplifier as claimed in claim 6, characterized in that the resister (R) is directly connected to the power supply terminal ($V_{DD}$).

10. An amplifier as claimed in claim 7, characterized in that the resistor (R) is directly connected to the power supply terminal ($V_{DD}$).

\* \* \* \* \*